United States Patent [19]

Sugiyama et al.

[11] Patent Number: 4,781,600
[45] Date of Patent: Nov. 1, 1988

[54] JUNCTION BOX AND A PROCESS OF ASSEMBLING THE SAME

[75] Inventors: Masaaki Sugiyama; Mitsugu Watanabe; Hideharu Hayashi; Yukio Nishio; Masaki Yamamoto, all of Kosai, Japan

[73] Assignee: Yazaki Corporation, Tokyo, Japan

[21] Appl. No.: 59,639

[22] Filed: Jun. 8, 1987

[30] Foreign Application Priority Data

Jun. 25, 1986 [JP] Japan .............................. 61-146845
Jun. 25, 1986 [JP] Japan .............................. 61-146846
Jun. 25, 1986 [JP] Japan .......................... 61-095939[U]
Jun. 25, 1986 [JP] Japan .......................... 61-095939[U]

[51] Int. Cl.⁴ .............................................. H01R 29/00
[52] U.S. Cl. .................................... 439/45; 29/830;
29/833; 29/834; 439/65; 439/74; 439/85;
439/695
[58] Field of Search ...................... 439/45, 65, 74-78,
439/83-85, 278, 528, 547-549, 554, 572, 684,
695, 703, 714; 29/830, 883, 884

[56] References Cited

U.S. PATENT DOCUMENTS

| 3,516,156 | 6/1970 | Steranko | 439/85 |
|---|---|---|---|
| 3,701,964 | 10/1972 | Cronin | 439/45 |
| 4,208,080 | 6/1980 | Teagno | 439/45 |
| 4,444,452 | 4/1984 | Hilbrandt et al. | 439/695 |
| 4,513,355 | 4/1985 | Schroeder et al. | 439/65 |
| 4,683,653 | 8/1987 | Iwasa | 29/830 |
| 4,685,753 | 8/1987 | Isshiki et al. | 439/74 |
| 4,686,766 | 8/1987 | Dubbs et al. | 29/883 |

Primary Examiner—Gil Weidenfeld
Assistant Examiner—Paula A. Austin
Attorney, Agent, or Firm—Armstrong, Nikaido, Marmelstein & Kubovcik

[57] ABSTRACT

A watertight and leak-proof junction box for use, for example, in vehicles such as automobiles, and a process of assembling such a junction box are provided. The wiring board assembly comprising a plurality of insulating plates, wiring conductors strips and electric contacts formed by raising the free ends of the strips so as to project from the outer surface of the wiring plate pile which is embedded in an insulating resin through molding to form a resin-embedded wiring board assembly prior to assembling the junction box, and then the resin-embedded wiring board assembly joined with a connector support board having connector bodies for receiving the terminals of electrical units and/or wire harnesses is contained in a watertight case. A leak preventing wall is formed so as to surround the base portion of each electric contacts, so that the flow of leak current between the adjacent contacts is prevented even if water intrudes into the watertight case and spreads over the outer surface of the wiring board assembly.

10 Claims, 5 Drawing Sheets

JUNCTION BOX AND A PROCESS OF ASSEMBLING THE SAME

BACKGROUND OF THE INVENTION

1. Field of the Invention

The present invention relates to a junction box for connecting and branching the terminals of wire harnesses or electrical units on automobiles or the like, and a process of assembling such a junction box.

2. Description of the Prior Art

Complicated wiring of the electrical circuit in a vehicle such as an automobile, is readily completed by connecting the terminals of electrical units and wire harnesses to external connectors formed in the insulating case of a junction box formed by properly arranging conductors interconnecting the electric contacts in the insulating case. As such a junction box in general is disposed in the engine room, the junction box is often exposed to oil and water as well as to high temperature. Particularly, when the engine room is washed with a spout of high-pressure water, it is possible that water intrudes into the junction box even if the same is covered with a watertight cover. Accordingly, the insulation of the junction box is reinforced by filling voids within the insulating housing with a thermosetting resin such as an epoxy resin, and hardening the resin after placing wiring boards carrying conductors in the insulating case so as to enclose the wiring boards with the resin.

However, since the connector bodies of the junction box for receiving external connectors are formed in the upper and lower surfaces of the insulating case in the junction box, and the electric contacts thereof are connected to the conductors and penetrating through the upper and lower surfaces are arranged in the connector bodies, the connecting function of the contacts will be spoiled if the resin fulled in the insulating case leaks out through the through holes through which the contacts are projecting and adheres to the contacts. To prevent the leakage of the resin from the insulating housing through gaps between the contacts and the through holes due to the excessive filling of the resin in the housing and or due to the expansion of the resin filled in the housing, packings need to be attached scrupulously to the housing and the exact amount of the resin needs to be filled in the housing. Furthermore, a long time required for hardening the resin affects adversely to the productivity of the process for manufacturing such a junction box.

On the other hand, as illustrated in FIG. 10, to arrange the contacts b accurately in a connector body formed in the bottom cover c on its outer surface, a packing for preventing the leakage of the resin is attached to the backside of the cover c, then the wiring plate pile a is joined to the cover c by inserting contacts b through holes h formed in an accurate arrangement in the cover c, then the assembling of the cover c and the wiring plate pile a is placed in an insulating housing which is then filled with a thermosetting resin, in which the filled resin is hardened by heating. However, such a junction box includes many parts and requires many assembling processes, scrupulous work in assembling the parts without allowing the resin to leak, and a long time for hardening the resin, which affects adversely to the productivity of the manufacturing process.

To solve such problems in the conventional junction boxes, the inventors of the present invention have previously proposed a process of assembling a junction box comprising steps of embedding a pile of a plurality of insulating plates in an insulating resin to form a wiring board assembly, and mounting the wiring board assembly in an insulating housing. Such an assembling process improves the insulation between the conductors within the insulating housing, whereas the watertightness between the contacts and the housing is not necessarily improved and the problem of current leak between the contacts cannot be solved. Furthermore, such an assembling process requires to form the insulating plate pile and the insulating housing in a paricularly high dimensional accuracy, and the positioning error even in a single part make assembling the junction box impossible.

SUMMARY OF THE INVENTION

It is therefore an object of the present invention to provide a junction box resistant to the deterioration of the insulation of the electrical contacts and facilitating the assembling process.

It is another object of the present invention to provide a junction box having an insulating plate pile embedded in a resin to form a wiring board assembly and facilitating the assembling process.

It is a further object of the present invention to provide a highly productive process of assembling a junction box which is highly reliable in watertightness and function.

According to one aspect of the preset invention, a junction box comprises: a wiring board assembly including a multiple-layered wiring plate pile embedded in insulating resin and having insulating plates and conductor strips one over the other and electrical contacts projecting from the outermost insulating plates; an insulating connector support board having a connector body or bodies each having through holes for receiving the electrical contacts in said wiring board assembly, and joined to the assembly so as to receive the contacts projecting from the outer surface of the assembly in the through holes of the connector body or bodies thereof; a box housing receiving an assemblage of the wiring board assembly and the connector support board; and preferably a watertight cover attached to the box housing so as to seal the wiring board assembly in the junction box.

According to another aspect of the present invention, a process of assembling a junction box comprises steps of: forming a wiring plate pile by alternately overlapping insulating plates and wiring conductor strips with the respect in free ends of the strips projecting from the outer most insulating plates in the wiring plate pile to form electric contacts, masking the plate pile with the contacts with masking blocks; placing the masked wiring plate pile in a mold; forming a wiring board assembly by pouring an insulating resin into the mold to embed the wiring plate pile in the insulating resin except the electric contacts; taking out said wiring board assembly from the mold; removing the masking blocks; attaching a connector support board having connector body or bodies each having through holes for receiving the electrical contacts in the wiring board assembly in the through holes; connecting electrical units to the connector body or bodies in said connector support board with the electrical units to be connected with the contacts; placing the assemblage of the wiring board assembly and the connector support board in a junction box housing; and preferably attaching a watertight cover to the box housing to seal the assemblage mounted with the electric units in the box housing.

BRIEF DESCRIPTION OF THE DRAWINGS

The above and other objects, features and advantages of the present invention will become more apparent from the following description taken in conjuction with the accompanying drawings, in which.

DESCRIPTION OF THE PREFERRED EMBODIMENTS

Referring to FIGS. 1 to 4, there is shown a junction box in a disassembled form, of a substantial rectangular hexahedron shape in a preferred embodiment according to the present invention which has insulating plates A of rectangular shape, each having a plurality of through-holes for receiving electric contacts b formed by bending or raising the free ends of conductor strips B, respectively, in a wiring plate pile C formed by alternately overlapping the conductor strips B and the insulating plates A one over the other. The wiring plate pile C having insulating plates A is placed in a mold, into which an insulating resin is poured, to embed them in an insulating resin sheath E and to form a resin-embedded wiring board assembly D. The insulating resin sheath E covers all the surface of the wiring plate pile C except the electric contact B extending from upper and lower surfaces of the wiring board assembly D. A connector support board or upper cover G having a plurality of connector bodies H formed on its upper surface for receiving the conductors of wire harnesses and/or the terminals of electric devices such as, for example, relays is contacted and connected to the upper surface of the wiring board assembly D by inserting the respective electric contacts b into the corresponding connector bodies H. A bottom cover F provided with connector bodies g each having an opening f in the bottom wall thereof to receive a group of the electric contacts b projecting from the bottom surface of the resin-embedded wiring board assembly D therethrough to connect the junction box to external circuits. A watertight cover I is engaged with the bottom cover F on the upper surface for sealing the upper surface of the connector supporting board G.

Figure 1:
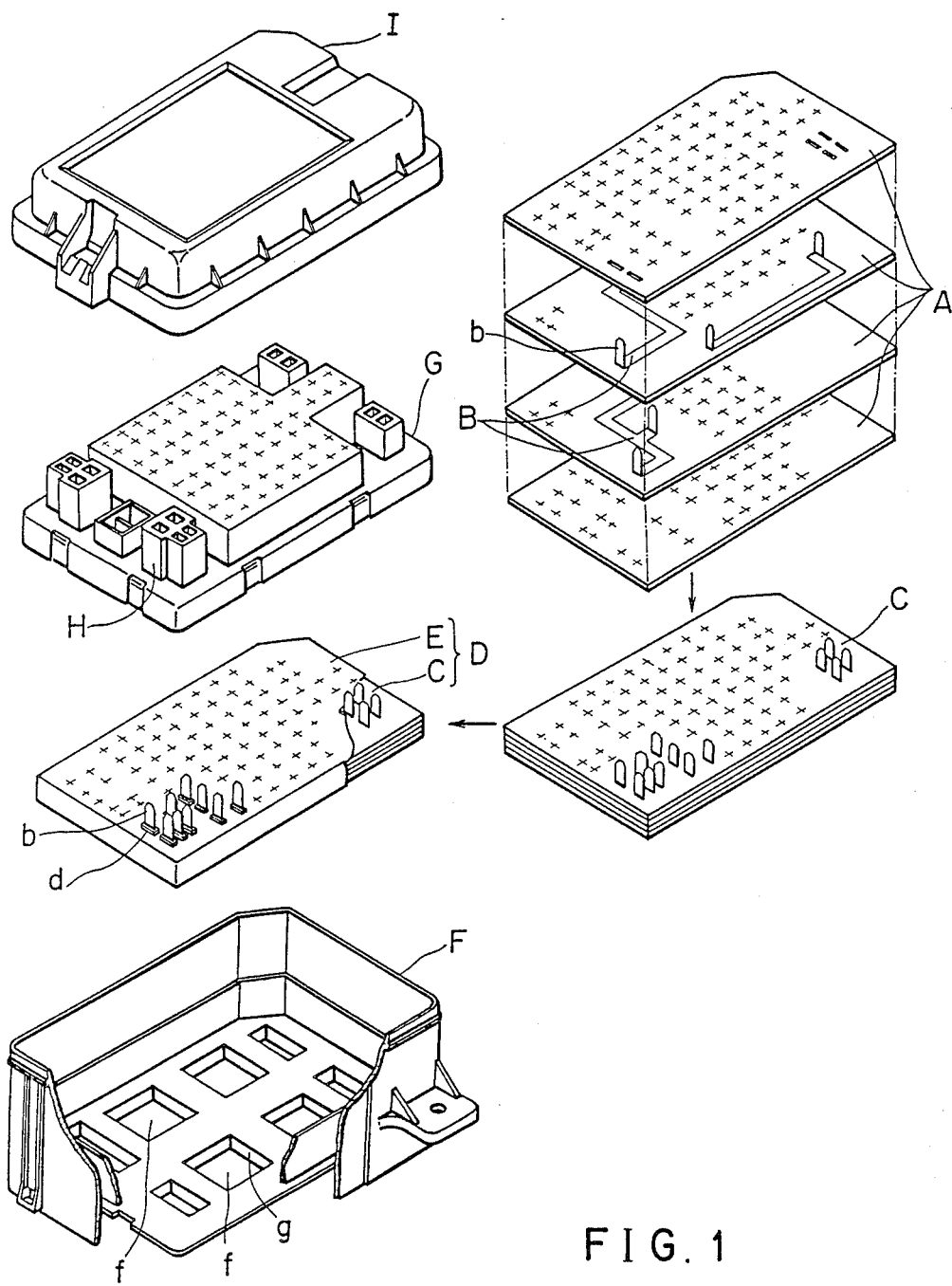
FIG. 1 is an exploded perspective view of a junction box, in a preferred embodiment, according to the present invention.
Figure 2:
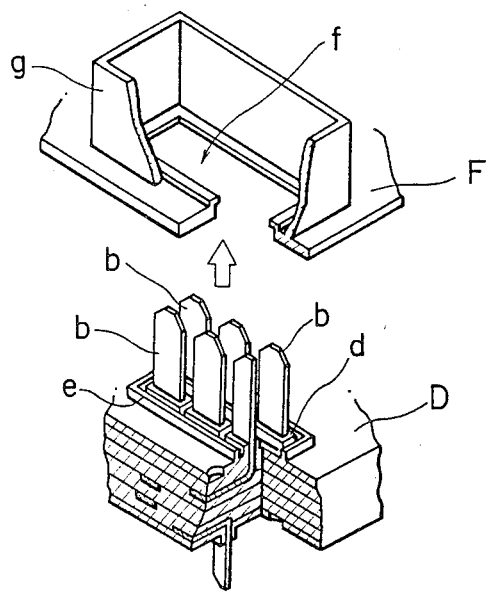
FIG. 2 is an enlarged perspective view showing a connector body and electric contacts of the junction box of FIG. 1.
Figure 3:
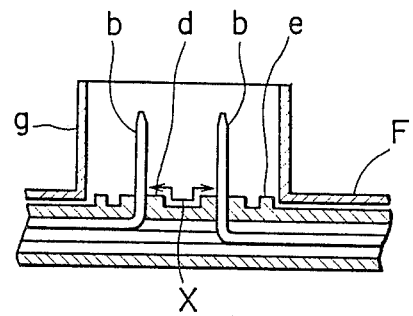
FIG. 3 is a fragmentary sectional view of the junction box of FIG. 1, showing the connector thereof.
Figure 4:
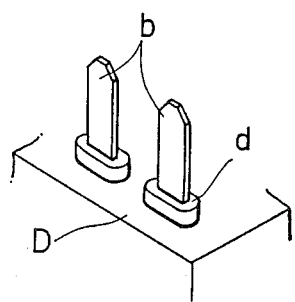
FIG. 4 is a fragmentary enlarged perspective view of the connector contacts and the leak preventing walls.
Figure 10:
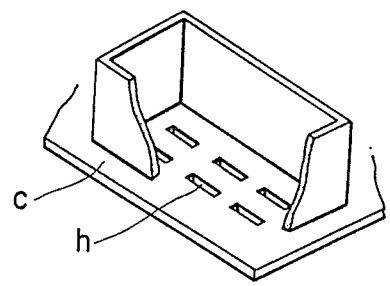
FIG. 10 is a fragmentary exploded perspective view of a conventional junction box.
Figure 10:
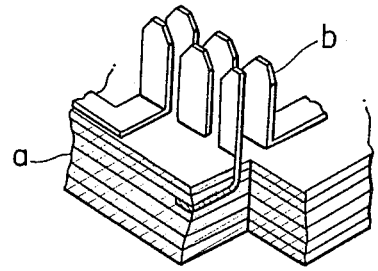

The electric contact b projecting from the upper surface of the wiring board assembly D are received in the respective connector bodies H formed in the connector support board G. The respective base portions of the contacts b projecting from the upper and lower surfaces of the wiring board assembly D are enclosed by leak preventing walls d formed integrally with the insulating resin sheath E and rising by a height from the upper and lower surfaces of the wiring board assembly D, respectively. If necessary, an outer wall e may further be formed integrally with the insulating resin sheath E so as to enclose the leak preventing walls d of each group of the contacts b. There is no restriction to the respective shapes of the leak preventing walls d and the outer walls e; the shapes need not necessarily be rectangular as illustrated in FIG. 4. Furthermore, the outer walls e need not necessarily be onefold; the same may be twofold or threefold.

The external size of the openings f of the bottom cover F must be slightly greater than that of the leak preventing walls d or that of the outer walls e when the outer walls e are formed so that the leak preventing walls d or the outer walls e will not interfere with the bottom cover F in assembling the wiring board assembly D and the bottom cover F.

Even if water intrudes into the junction box through gaps between the watertight cover I and the connector support board G or gaps between the connector bodies H, the flow of leak current between the adjacent contacts b attributable to the connection of the adjacent contacts b by a water film is not liable to occur because the spread of water along the surface of wiring board assembly D to the contact b is intercepted by the leak preventing walls d and the outer walls e and the substantial distance X (FIG. 3) between the adjacent connector contacts b is increased by the leak preventing walls d.

Furthermore, as the wiring board assembly D is formed by embedding the wiring plate pile C in the insulating resin sheath E, water is unable to penetrate the wiring board assembly D.

Still further, such a highly insulating construction is formed simply by embedding the wiring plate pile in an insulating resin and the junction box can be easily assembled, which enhances the productivity of the junction box manufacturing process.

Figure 5A:
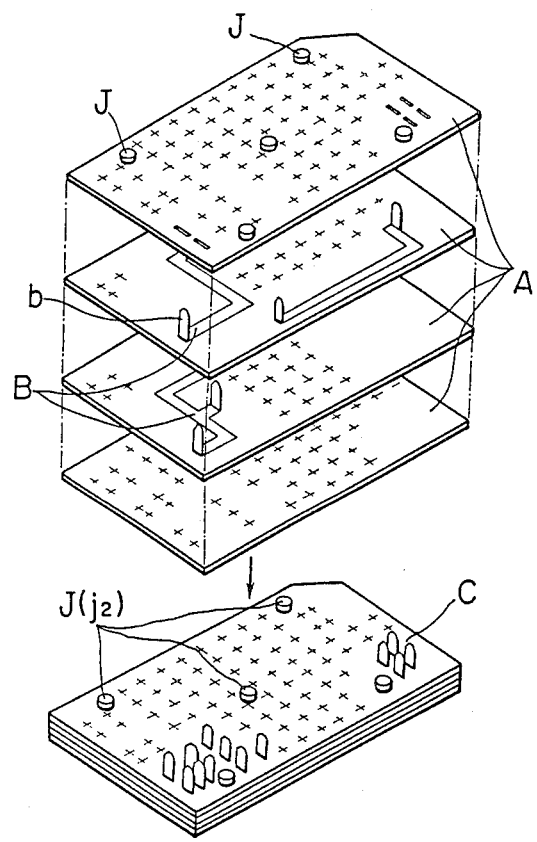
FIG. 5a is an exploded perspective view of assistance in explaining the constitution of the wiring board assembly of a junction box, in a preferred embodiment, according to the present invention.
Figure 5B:
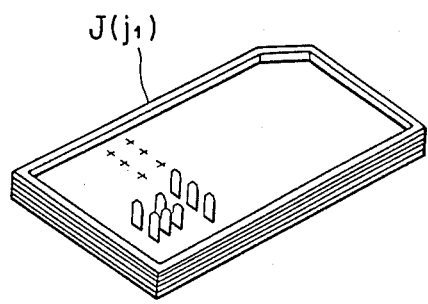
FIGS. 5b and 5c are perspective views of the wiring board assemblies of junction boxes embodying the present invention, respectively.
Figure 5C:
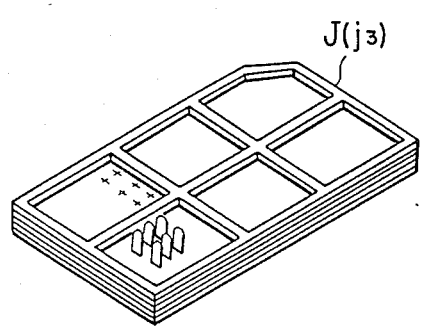
Figure 6:
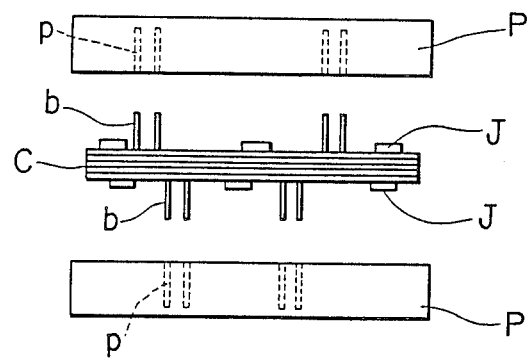
FIG. 6 is a side elevation of assistance in explaining the relation between a wiring board assembly and masking covers for forming a masked wiring board assembly in accordance with a process of assembling a junction box of the present invention.

A junction box, in a second embodiment, according to the present invention will be described hereinafter with reference to FIGS. 5a to 5c. The second embodiment is substantially the same as the first embodiment in construction and function except that the wiring plate pile C according to the second embodiment is provided with spacing members J formed integrally with or formed separately and attached to the top and bottom insulating plates A of the wiring plate pile C to provide gaps between the top and bottom surfaces of the wiring plate pile C when it is placed in a mold to embed the pile C in an insulating resin to sheath the pile C in a resin sheath E. The spacing members J may be projections $j_2$ as shown in FIG. 5a, frames $j_1$ as shown in FIG. 5b or grids $j_3$ as shown in FIG. 5c.

A process of assembling the junction box in accordance with the present invention will be described hereinafter with reference to FIGS. 6 to 9.

A wiring plate pile C is formed by alternately placing insulating plates A and strips B one over the other. Each plate A is formed of a heat-resistant resin and is provided with through-holes for tightly receiving electric contacts b formed by raising the respective free ends of the conductor strips B therethrough.

Figure 7:
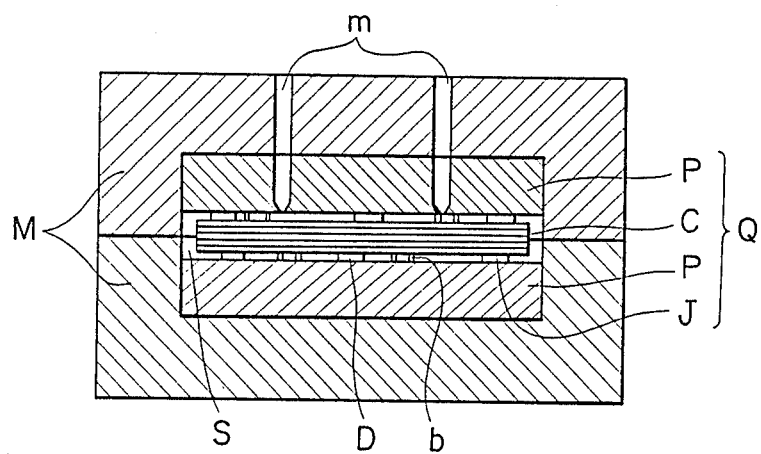
FIG. 7 is a sectional view showing the disposition of a masked wiring board assembly in a mold for embedding the masked wiring board assembly in a resin.

A masked wiring board assembly Q is formed by holding the wiring plate pile C between a pair of masking blocks P with the respective inner surfaces of the masking blocks P in contact with the spacing members J so as to receive the contact b in holes p formed in the masking blocks P. The masking blocks P are formed of a heat-resistant material such as a metal or a heat-resistant resin and are integral members of a mold M for embedding the wiring plate pile C in an insulating resin (FIG. 7).

The thus masked wiring plate pile C is placed in the mold M having sprues m. A cavity S is formed around the wiring plate pile C and the inner surfaces of the masking blocks P are separated from the corresponding surfaces of the pile C at a predetermined distance by the spacing members J.

Figure 8:
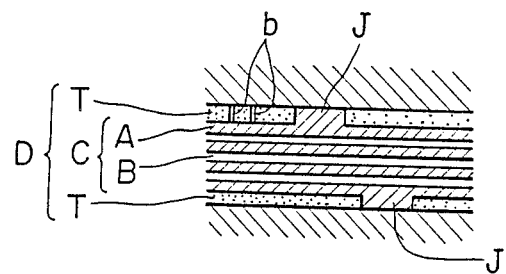
FIG. 8 is a fragmentary sectional view showing the condition of the resin filling cavities in the mold of FIG. 7.
Figure 9:
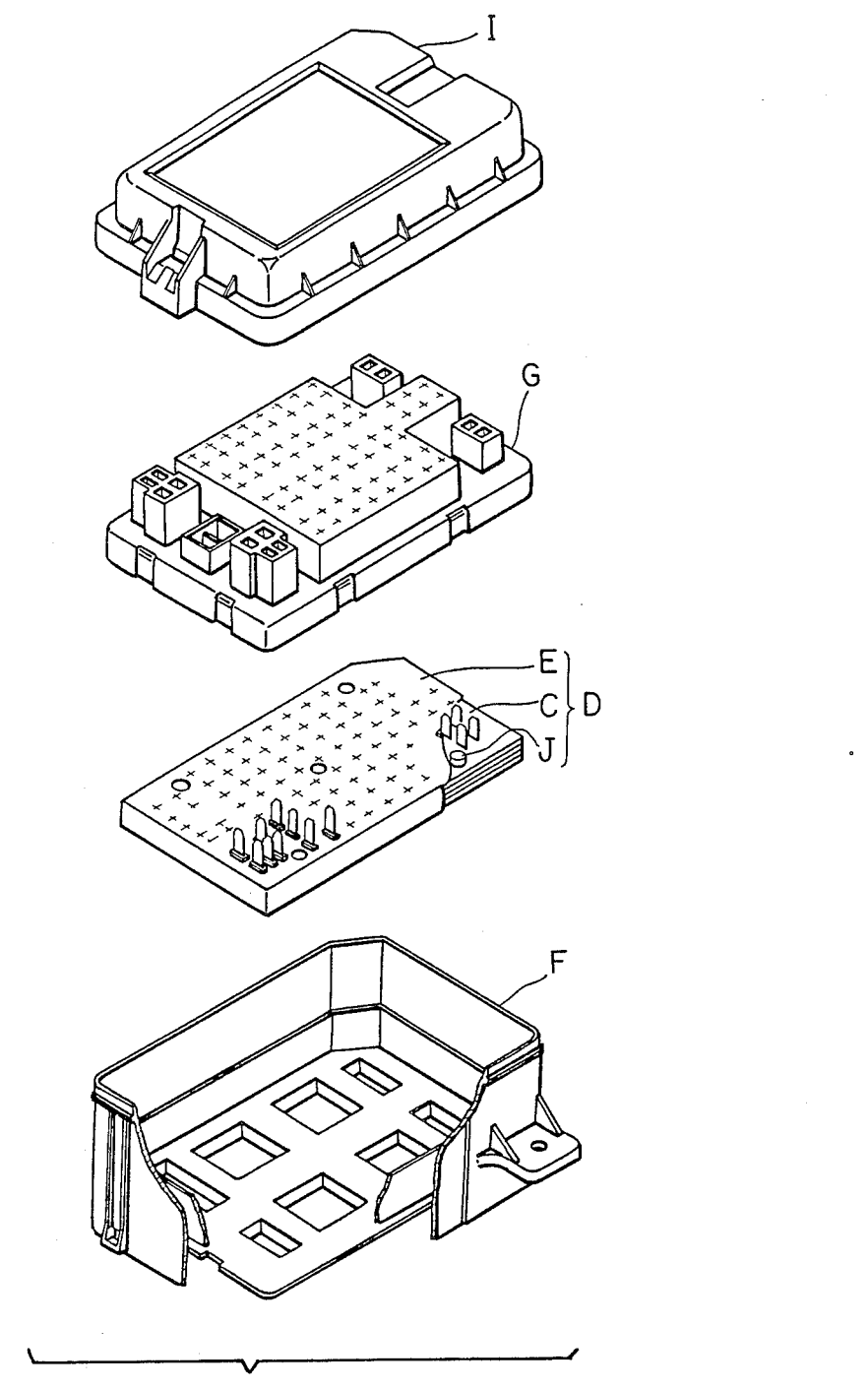
FIG. 9 is an exploded perspective view of assistance in explaining a process of assembling a junction box, in a preferred embodiment, according to the present invention.

Then, an insulating resin T is poured through the sprues m into the mold M to embed the wiring plate pile C in the insulating resin T to form a wiring board assembly D (FIG. 8). The insulating resin T may be a two-component reaction type thermosetting resin or, more preferably, a thermoplastic resin such as hard vinyl chloride resin, which adheres firmly to the insulating plates A and the spacing members J and will not deform the same. When as the insulating resin T is used a termoplastic resin, the wiring plate pile C can be embedded in the insulating resin T through injection molding, in which the mold M need not be preheated and the molding needs only cooling and thereby the embedding process is achieved efficiently.

Then, after the wiring board assembly D is placed in a junction box housing or bottom cover F, a connector support board is placed on top of the assembly D, and then electric units such as relays are connected to the connectors in the wiring board assembly D, and finally a watertight cover I is fixed to the top periphery of side wall in the box housing F to complete the junction box.

The electric contacts b are masked with the masking blocks P during the embedding of the wiring plate pile C in the insulating resin through molding so that they are never coated with the insulating resin to spoil the function thereof, and the wiring plate pile C is embedded perfectly in the insulating resin to provide a junction box of high reliability.

Furthermore, any defects in the configuration of the wiring plate pile C can be found before the molding process and faulty wiring board assemblies are eliminated before the molding process, so that perfect and faultless wiring board assemblies are supplied to the following junction box assembling processes to enable efficient assembling work and to provide junction boxes of high reliability.

Although the invention has been described in its preferred forms with a certain degree of particularity, it is to be understood to those skilled in the art that many changes and variations are possible in the invention without departing from the scope and spirit thereof.

What is claimed is:

1. A junction box comprising:
   a wiring board assembly including a multiple-layered wiring plate pile embedded in insulating resin and having insulating plates and conductor strips one over the other and electrical contacts outwardly projecting from the outer most insulating plates;
   at least one insulating connector body having through holes for receiving the electrical contacts in said wiring board assembly, and joined to said assembly so as to receive the contacts projecting from the outer surface of said assembly in the through holes of the connector body; and
   a box housing receiving an assemblage of said wiring board assembly and said connector body.

2. A junction box as recited in claim 1, wherein a watertight cover is attached to said box housing so as to seal the wiring board assembly in the junction box.

3. A junction box as recited in claim 1 or 2, wherein projections, frames or grids are formed integrally with the outermost insulating plates of said wiring board assembly, respectively, to define a space surrounding said assembly when said assembly is placed in a mold for embedding said assembly in an insulating resin.

4. A junction box as recited in claim 1 or 2, wherein said insulating resin is a thermosetting synthetic resin.

5. A junction box as recited in claim 1 or 2, wherein said insulating resin is a thermoplastic synthetic resin.

6. A junction box assembling process comprising the steps of:
   forming a wiring plate pile by alternately overlapping insulating plates and wiring conductors strips with the respective free ends of the strips projecting from the outermost insulating plates in the wiring plate pile to form electric contacts;
   masking the wiring plate pile with the contacts with masking blocks;
   placing said masked wiring plate pile in a mold;
   forming a wiring board assembly by pouring an insulating resin into the mold embed said wiring plate pile in the insulating resin except the electric contacts;
   taking out said wiring board assembly from the mold;
   removing said masking blocks from said wiring board assembly;
   attaching a connector support board having at least one connector body each having through holes for receiving the electric contacts in said wiring board assembly in the through holes;
   connecting electrical units to the at least one connector body in said connector support board with electrical units to be connected to the contacts; and
   placing the assemblage of said wiring board assembly and said connector support board in a junction box housing.

7. A junction box assembling process as recited in claim 6, wherein it also comprises a step of attaching a watertight cover to said bottom case so as to seal said the assemblage of said wiring board assembly and said connector support board mounted with the electric units in said bottom case.

8. A junction box assembling process as recited in claim 6 or 7, wherein said step of forming said wiring board assembly employs injection molding process.

9. A junction box assembling process as recited in claim 6 or 7, wherein said insulating resin is a thermosetting synthetic resin.

10. A junction box assembling process as recited in claim 6 or 7, wherein said insulating resin is a thermoplastic synthetic resin.

* * * * *